United States Patent [19]

Masuda et al.

[11] Patent Number: 4,524,327
[45] Date of Patent: Jun. 18, 1985

[54] OPERATIONAL AMPLIFIER

[75] Inventors: Eiji Masuda, Kawasaki; Kenji Matsuo, Yokohama, both of Japan

[73] Assignee: Tokyo Shibaura Denki Kabushiki Kaisha, Kawasaki, Japan

[21] Appl. No.: 394,615

[22] Filed: Jul. 2, 1982

[30] Foreign Application Priority Data

Jul. 9, 1981 [JP] Japan ................ 56-107473

[51] Int. Cl.³ ............................ H03F 1/34; H03F 3/45
[52] U.S. Cl. ..................................... 330/253; 330/107;
330/260; 330/294
[58] Field of Search ............... 330/107, 253, 260, 294,
330/307

[56] References Cited

U.S. PATENT DOCUMENTS 4,335,355 6/1982 Haque .................................. 330/253
4,371,843 2/1983 Fang et al. ......................... 330/253

FOREIGN PATENT DOCUMENTS 52-49755 4/1977 Japan .

OTHER PUBLICATIONS

Yusuf A. Haque et al., "A Two Chip PCM Voice CODEC With Filters", IEEE J. Solid-State Circuits, vol. SC-14, pp. 961-969, Dec. 1979.

Primary Examiner—James B. Mullins
Attorney, Agent, or Firm—Finnegan, Henderson, Farabow, Garrett & Dunner

[57] ABSTRACT

An operational amplifier which comprises a first amplifying circuit; a second amplifying circuit which is connected to the first amplifying circuit and carries out inverting amplification; a third amplifying circuit which is connected to the second amplifying circuit, carries out noninverting amplification and has a gain of substantially 1; a first feedback circuit which is connected between the output and input terminals of the second amplifying circuit and carries out phase-compensation; and a second feedback circuit which is connected between the output terminal of the third amplifying circuit and the input terminal of the second amplifying circuit, and carries out phase-compensation.

5 Claims, 14 Drawing Figures

F I G. 4
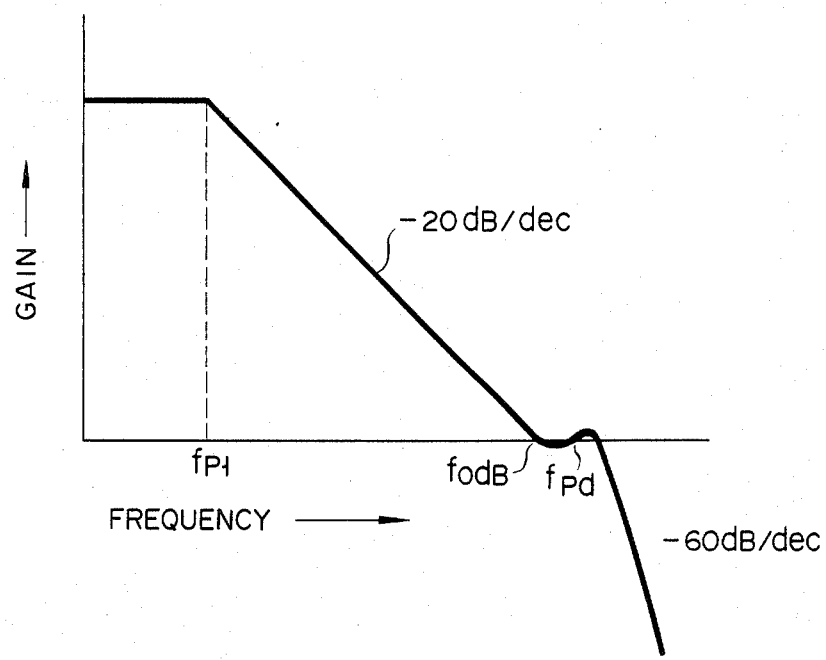

F I G. 5
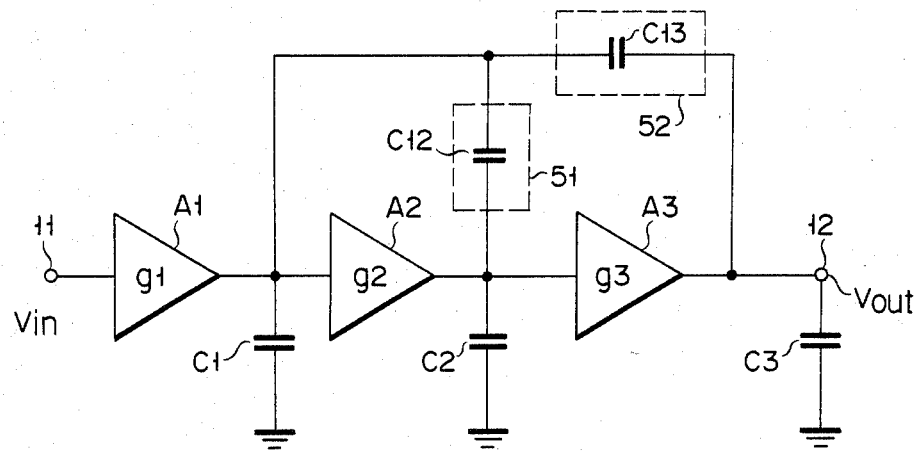
F I G. 6
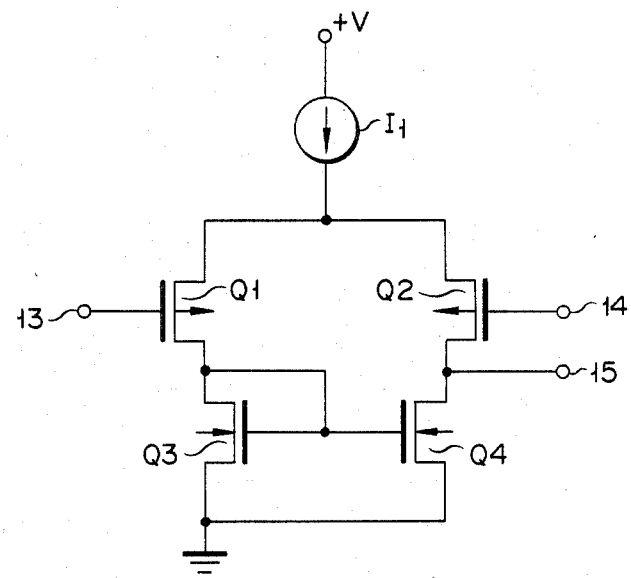

FIG. 10A
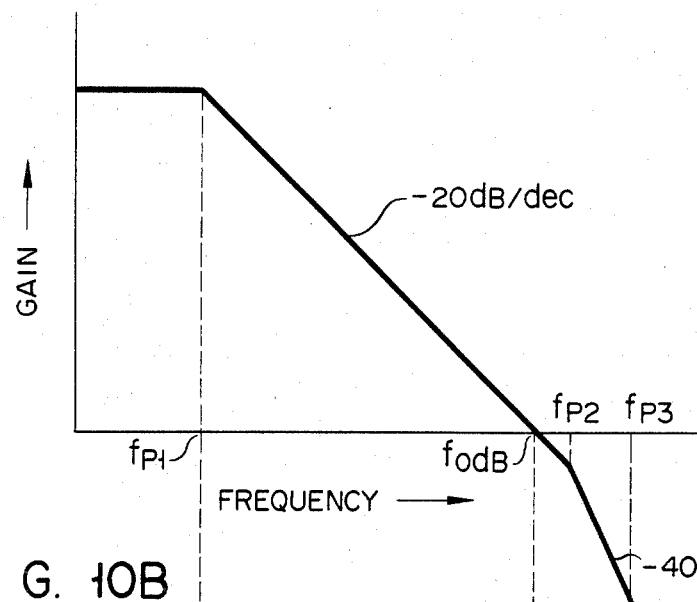
FIG. 10B
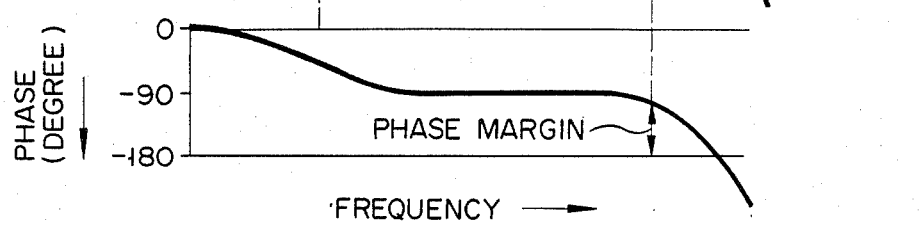
FIG. 11     FIG. 12     FIG. 13
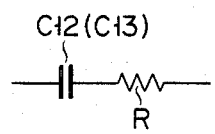 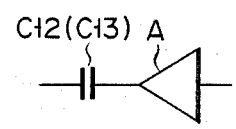 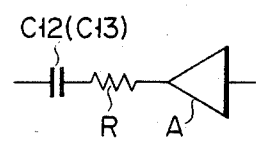

OPERATIONAL AMPLIFIER

BACKGROUND OF THE INVENTION

This invention relates to an operational amplifier provided with a phase compensation circuit.

To date, various phase compensation circuits have been proposed to assure a stable operation in a high frequency region.

An operational amplifier apparatus is generally formed of two cascade-connected amplifiers. However, such type of operational amplifier apparatus tends to be unstable in the broad band. A known process for eliminating the drawback is to connect a capacitor between the output terminal of a second one of the two cascade-connected amplifiers and a node or joint of the first and second amplifiers (FIG. 1). FIG. 2 illustrates the gain characteristic of the conventional operational amplifier apparatus, showing the presence of three poles $P_1$, $P_2$ and $P_3$. Now let it be assumed that the three pole frequencies are respectively represented by $f_{P1}$, $f_{P2}$ and $f_{P3}$. Then $f_{P2}$ and $f_{P3}$ are respectively expressed by the following equations:

$$f_{p2} \simeq \frac{g_2 C_4}{2\pi \{C_1 C_2 + C_4(C_1 + C_2)\}} \quad (1)$$

$$f_{p3} \simeq \frac{g_3}{2\pi C_3} \quad (2)$$

The unity gain frequency $f_{0dB}$ is expressed by the following equation:

$$f_{0dB} \simeq \frac{g_1}{2\pi C_4} \quad (3)$$

The unity gain frequency $f_{0dB}$ should have a value expressed as $f_{0dB} \ll f_{P2}$ and $f_{0dB} \ll f_{P3}$ in order to let the operational amplifier have a sufficient phase margin and carry out a stable operation in the broad band.

However, the transconductance of each operational amplifier constituted by MOSFETs ranges from several $\mu$mho to hundreds of $\mu$mho, and consequently presents difficulties in meeting the above-mentioned requirement. Assuming, for example, capacitance $C_3 = 50$ pF, conductance $g_3 = 200$ $\mu$mho, then there results frequency $f_{P3} \simeq 637$ kHz. Therefore, it is difficult to realize a broad band amplifier whose unity again frequency is expressed as $f_{0dB} \simeq 1$ MHz. Further, it is necessary to let the MOSFET of the output buffer stage $A_3$ have a great channel width in order to enlarge the conductance $g_3$ for an increase in the frequency $f_{P3}$. An attempt to satisfy such requirement is accompanied with the drawbacks of presenting difficulties in integrating the subject operational amplifier apparatus and increasing its lower power consumption.

The Japanese patent laid-open application No. 52-49,755 sets forth another process of resolving the above-mentioned drawbacks. As shown in FIG. 3, this prior art operational amplifier comprises a first amplifier $A_1$, second amplifier $A_2$ and output stage $A_3$. An output signal from this output stage $A_3$ is negatively fed back to the junction of the first and second amplifiers. The operational amplifier of the Japanese patent laid-open application No. 52-49,755 arranged as described above has the advantage of eliminating various drawbacks accompanying the conventional amplifier of FIG. 1. Where, however, a MOSFET is used as an amplifying element, the gain characteristic of the operational amplifier of the Japanese patent laid-open application No. 52-49,755 is handicapped by the fact that a quadratic pole tends to arise. FIG. 4 illustrates the gain characteristic of a general operational amplifier having a quadratic pole. The gain characteristic tends to indicate a peak in the proximity of a unity gain frequency $f_{0dB}$. This peak results from a quadratic pole frequency $f_{Pd}$. At this quadratic pole frequency $f_{Pd}$, the phase is suddenly rotated through 180°, leaving no phase margin. Only where, therefore, the condition of $f_{0dB} \ll f_{Pd}$ is established, it has been impossible in the past to realize a broad band amplifier. The above-mentioned quadratic pole frequency $f_{Pd}$ is expressed as $$f_{Pd} \simeq \frac{1}{2\pi} \sqrt{\frac{g_2 g_3}{C_2 C_3}}.$$

To eliminate the peaking phenomenon, it is necessary to let a certain constant $\delta$ on an equivalent circuit have a larger value than 1. In this case the constant $\delta$ is expressed as:

$$\delta = \frac{r_2 C_2 + \frac{C_3}{g_3}}{2 r_2 g_2} \sqrt{\frac{g_2 g_3}{C_2 C_3}} \quad (4)$$

$r_2$ denotes an output resistance of the second operational amplifier $A_2$. If it is tried to let the capacitance $C_3$, the conductances $g_2$ and $g_3$ have such a value as meets the requisite condition of the constant $\delta$, then the quadratic pole frequency $f_{Pd}$ decreases, failing to improve the phase margin. The capacitor $C_2$ represents a sort of parasitic capacitance, and consequently has little latitude to be modified for the design and manufacture of an operational amplifier. Further, an attempt to reduce an output resistance $r_2$ results in a decline in the DC gain of the second operational amplifier. The DC gain is expressed as $-g_2 r_2$. Therefore, it is necessary to let $g_2$ have a large value in order to decrease the output resistance $r_2$ without reducing the DC gain. This means that the MOSFET of the second operational amplifier $A_2$ must have an enlarged channel width, undesirably reducing the latitude with which the subject operational amplifier can be integrated.

SUMMARY OF THE INVENTION

It is accordingly an object of this invention to provide an operational amplifier which can have a large phase margin in a broad band.

Another object of the invention is to provide an operational amplifier which can save power consumption.

To attain the above-mentioned object, this invention provides an operational amplifier apparatus which comprises three series-connected amplifiers, and wherein the second stage amplifier has a function of carrying out inverting amplification; the third stage amplifier has a function of carrying out noninverting amplification and indicates a gain of substantially 1; a first feedback circuit having a phase-compensating function is provided between the output and input terminals of the second stage amplifier; and a second feedback circuit having a phase-compensating function is provided between the output terminal of the third stage amplifier and the input terminal of the second stage amplifier.

An operational amplifier embodying this invention which is arranged as described above can easily suppress the occurrence of a quadratic pole which has been observed in the conventional operational amplifier, and consequently has a large phase margin in a broad band. Further, the operational amplifier of the invention which is formed of a MOS transistor having an ordinary channel width is saved from a decline in the degree of integration and large power consumption.

BRIEF DESCRIPTION OF THE DRAWINGS

Other objects and advantages will be apparent from the following description when taken in conjunction with the accompanying drawings, in which:

FIG. 4 graphically indicates the gain vs frequency characteristic of the another conventional operational amplifier of FIG. 3;

FIG. 5 is a circuit diagram of an operational amplifier embodying this invention;

FIG. 6 is a circuit diagram of a first stage amplifier included in the subject operational amplifier of FIG. 5;

FIG. 10A graphically indicates the gain vs frequency characteristic of the subject operational amplifier of FIG. 5;

FIG. 10B sets forth the phase vs frequency characteristic of the subject operational amplifier of FIG. 5; and FIGS. 11 to 13 are circuit diagrams of modifications of the phase-compensating feedback circuit included in the operational amplifier of the invention.

DETAILED DESCRIPTION OF THE PREFERRED EMBODIMENTS

Figure 1:
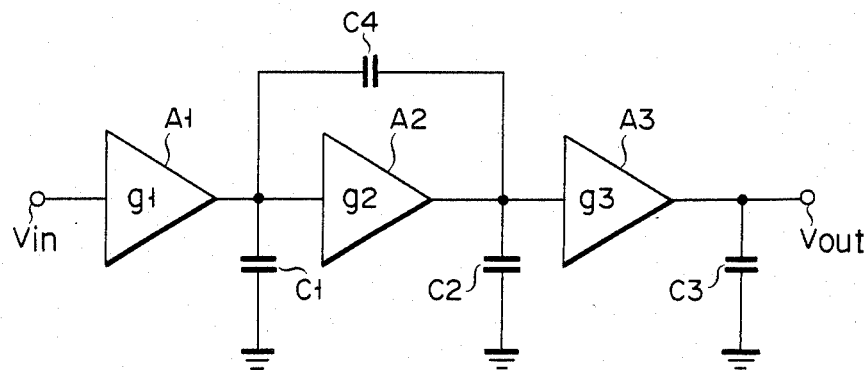
FIG. 1 is a circuit diagram of the conventional operational amplifier.
Figure 2:
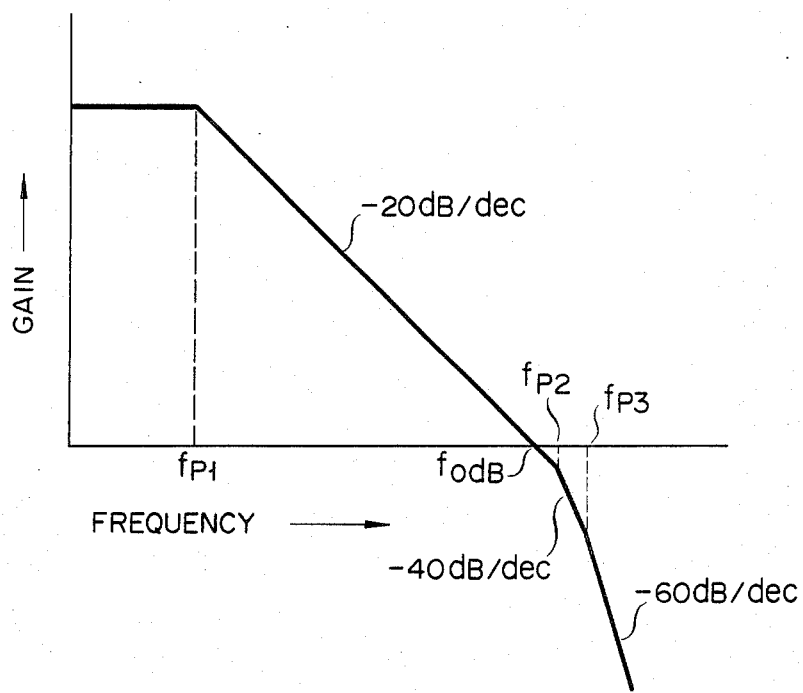
FIG. 2 graphically shows the gain vs frequency characteristic of the conventional operational amplifier illustrated in FIG. 1.

Description is now given with reference to FIG. 5 of an operational amplifier according to a first embodiment of this invention.

The subject operational amplifier comprises three series-connected operational amplifiers $A_1$, $A_2$ and $A_3$ and two phase-compensating capacitors $C_{12}$ and $C_{13}$. A first stage operational amplifier $A_1$ is generally of the differential type. A second stage operational amplifier $A_2$ is of the inverting amplification type. A third stage operational amplifier $A_3$ is an output buffer such as a source follower which carries out noninverting amplification. The first stage operational amplifier $A_1$ is connected to an input terminal 11, and a third stage operational amplifier $A_3$ is connected to an output terminal 12. A first feedback circuit 51 is provided between the output and input terminals of the second stage operational amplifier $A_2$. This feedback circuit 51 includes a capacitor $C_{12}$ used as a phase-compensating impedance element. Connected between the output terminal of the third stage operational amplifier $A_3$ and the input terminal of the second stage operational amplifier $A_2$ is a second feedback circuit 52 consisting of a capacitor $C_{13}$ used as a phase-compensating impedance element. Parasitic capacitors $C_1$, $C_2$ and $C_3$ are respectively formed on the output sides of the first, second and third stage operational amplifiers $A_1$, $A_2$ and $A_3$.

FIG. 6 illustrates the circuit arrangement of the first stage operational amplifier $A_1$. This amplifier comprises P channel MOS transistors $Q_1$ and $Q_2$, N channel MOS transistors $Q_3$ and $Q_4$ and constant current source $I_1$. The P channel MOS transistor $Q_1$ and N channel MOS transistor $Q_3$ are connected in series between the constant current source $I_1$ and ground. The P channel MOS transistor $Q_2$ and N channel MOS transistor $Q_4$ are also connected in series between the constant current source $I_1$ and ground. The gate electrodes of the transistors $Q_1$ and $Q_2$ are respectively connected to input terminals 13 and 14 of the first stage operational amplifier $A_1$. The node of the MOS transistors $Q_1$ and $Q_3$ is connected to the gate electrodes of the MOS transistors $Q_3$ and $Q_4$. The node of the MOS transistors $Q_2$ and $Q_4$ is connected to the output terminal 15 of the first stage operational amplifier $A_1$. This amplifier $A_1$ functions as a differential type.

Figure 7:
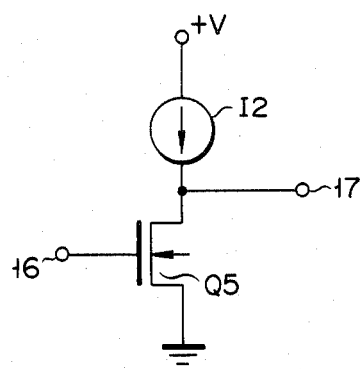
FIG. 7 is a circuit diagram of a second stage amplifier included in the subject operational amplifier of FIG. 5.

FIG. 7 shows the circuit arrangement of the second stage operational amplifier $A_2$. An N channel MOS transistor $Q_5$ is connected between a constant current source $I_2$ and ground. The gate electrode of the MOS transistor $Q_5$ is connected to the input terminal 16 of the second stage operational amplifier $A_2$. The node of the constant current source $I_2$ and MOS transistor $Q_5$ is connected to the output terminal 17 of the second stage operational amplifier $A_2$.

Figure 8:
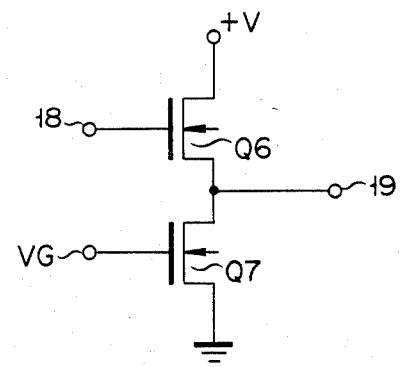
FIG. 8 is a circuit diagram of a third stage amplifier included in the subject operational amplifier of FIG. 5.

FIG. 8 indicates the circuit arrangement of the third stage operational amplifier $A_3$. N channel MOS transistors $Q_6$ and $Q_7$ are connected in series between a $+V$ power source and ground. A constant voltage VG is impressed on the gate electrode of the N channel MOS transistor $Q_7$. The gate electrode of the N channel MOS transistor $Q_6$ is connected to the input terminal 18 of the third stage operational amplifier $A_3$. The node of the MOS transistors $Q_6$ and $Q_7$ is connected to the output terminal 19 of the third stage operational amplifier $A_3$.

Figure 9:
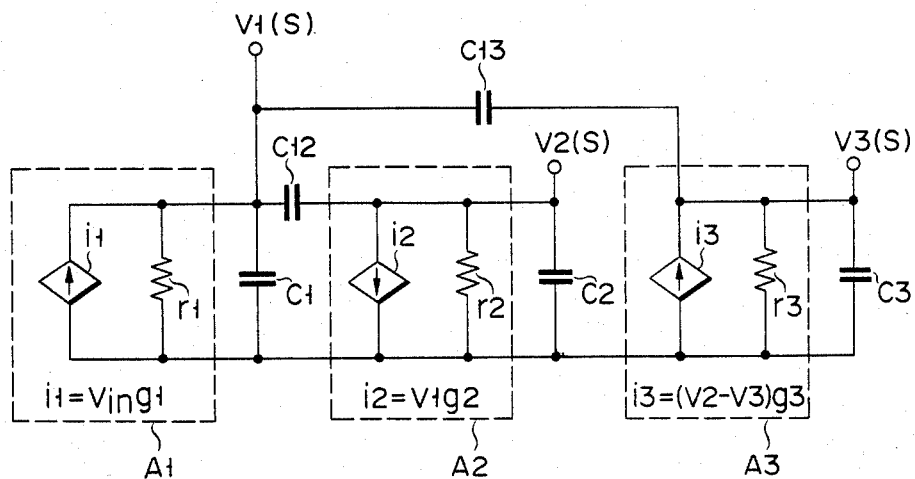
FIG. 9 is an equivalent circuit diagram of the subject operational amplifier of FIG. 5.

FIG. 9 is an equivalent circuit of the operational amplifier of FIG. 5 according to the first embodiment of this invention. $i_1$ and $r_1$ respectively represent the power source and output resistance of the first stage operational amplifier $A_1$. $i_2$ and $r_2$ respectively denote the power source and internal resistance of the second stage operational amplifier $A_2$. $i_3$ and $r_3$ respectively indicate the power source and internal resistance of the third stage operational amplifier $A_3$. The gain vs frequency characteristic and phase vs frequency characteristic of an operational amplifier whose arrangement is expressed by the equivalent circuit of FIG. 9 can be inferred from a transfer function $V_o/V_i$.

The following equation results from Kirchhoff's law, where S indicates $2\pi jf$.

$$\frac{V_o}{V_i} \simeq \frac{-r_1 r_2 g_1 g_2 \left(1 - \left(\frac{C_{13}}{g_2 g_3 r_2} + \frac{C_{12}}{g_2}\right) S - \frac{C_{13}(C_{12} + C_2)}{g_2 g_3} S^2\right)}{1 + r_1 r_2 g_2 (C_{12} + C_{13}) S + \frac{r_1 C_3}{g_3}(r_2 g_2 C_{12} + C_{13}) S^2 + \frac{r_1 r_2 C_3 C_{13}}{g_3}(C_{12} + C_2) S^3} \quad (5)$$

The pole frequencies $f_{P1}$, $f_{P2}$ and $f_{P3}$ shown in FIG. 10a may be approximated as follows:

$$f_{P1} \simeq \frac{1}{2\pi r_1 r_2 g_2 (C_{12} + C_{13})} \quad (6)$$

$$f_{P2} \simeq \frac{g_3(C_{12} + C_{13})}{2\pi C_3 C_{12}} \quad (7)$$

$$f_{P3} \simeq \frac{1}{2\pi} \left\{ \frac{1}{r_2(C_{12} + C_2)} + \frac{g_3}{C_3}\left(\frac{C_2}{C_{12} + C_2}\right) + \frac{g_2}{C_{13}}\left(\frac{C_{12}}{C_{12} + C_2}\right) \right\} \quad (8)$$

The above approximation is based on the condition:

$C_3 \gg C_1, C_2, C_{12}, C_{13}$ $C_3$ which represents an output load capacity of an operational amplifier has a sufficiently large value. The unity gain frequency $f_{0dB}$ having a gain of 1 is expressed as follows:

$$f_{0dB} = \frac{g_1}{2\pi(C_{12} + C_{13})} \quad (9)$$

With the operational amplifier of FIG. 5 according to the first embodiment of this invention, the following condition should be satisfied:

$f_{0dB} < f_{P2} < f_{P3}$ (10)

In order to let the whole of the operational amplifier carry out the phase-compensating function. No quadratic pole appears under the above-mentioned condition.

Now let it be assumed that the elements of the respective stages are formed of MOSFET elements having the following characteristic:

$g_1 = 20$ μmho
$g_2 = 20$ μmho
$g_3 = 100$ μmho
$C_{12} = 0.3$ pF
$C_{13} = 3$ pF ($> C_{12}$)
$C_2 = 0.3$ pF
$C_3 = 50$ pF
$r_1 = 5$ MΩ
$r_2 = 1$ MΩ

Then the frequencies $f_{0dB}$, $f_{P2}$ and $f_{P3}$ are respectively expressed as:
$f_{0dB} \simeq 1$ MHz
$f_{P2} \simeq 3.5$ MHz
$f_{P3} \simeq 5.7$ MHz
thereby meeting the aforementioned requirement.

Figure 3:
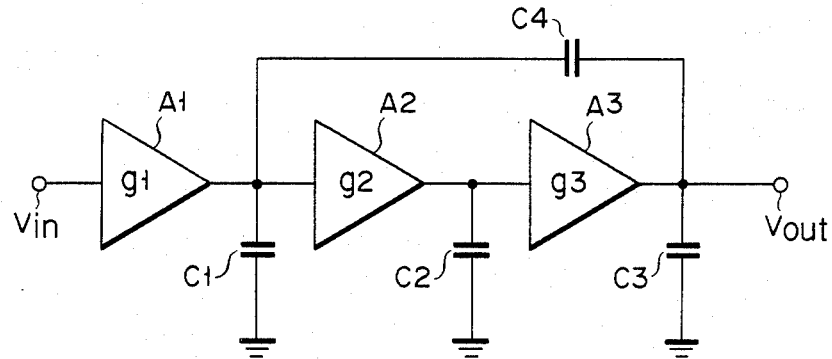
FIG. 3 is a circuit diagram of another conventional operational amplifier.

The fact that the occurrence of the quadratic pole can be easily suppressed in the operational amplifier of this invention is for the following reason. The pole frequencies $f_{P1}$, $f_{P2}$ and $f_{P3}$ of the conventional operational amplifier of FIG. 3 are expressed as:

$$f_{P1} \simeq \frac{1}{2\pi r_1 r_2 g_2 C_4} \quad (11)$$

$$f_{P2} \simeq \frac{g_2 r_2 g_3}{2\pi C_3} \quad (12)$$

$$f_{P3} \simeq \frac{1}{2\pi}\left(\frac{1}{r_2 C_2} + \frac{g_3}{C_3}\right) \quad (13)$$

when the equation (7)

$$f_{p2} \simeq \frac{g_3(C_{12} + C_{13})}{2\pi C_3 C_{12}}$$

relative to the operational amplifier of this invention is compared with the above equation $$f_{p2} \simeq \frac{g_2 r_2 g_3}{2\pi C_3}$$

relative to the conventional operational amplifier, it is seen that the $g_2 r_2$ of the equation (12) is replaced by $$\frac{C_{12} + C_{13}}{C_{12}}.$$

Further when compared with the above equation (13), the pole frequency $f_{P3}$ of the equation (8) relative to the operational amplifier of the invention, it is seen that the pole frequency $f_{P3}$ of the equation (8) further contains a high frequency pole expressed as $g_2/C_{13}$. Therefore, the technique applied to an operational amplifier embodying this invention enables the pole frequency $f_{P2}$ to be shifted to a lower frequency region and the pole frequency $f_{P3}$ to be shifted to a higher frequency region by applying the ordinary MOSFET design parameters. Consequently, the condition of $f_{P2} < f_{P3}$ can be easily satisfied, thereby suppressing the occurrence of a quadrapole.

As described above, with the operational amplifier of this invention, the pole frequencies $f_{P2}$ and $f_{P3}$ can be made to have a sufficiently higher level than the unity gain frequency $f_{0dB}$. The pole frequency $f_{P3}$ can be made to have a sufficiently higher level than the pole frequency $f_{P2}$. Even when, therefore, the operational amplifiers of the respective stages are formed of an element having a low transconductance, particularly a MOSFET, it is also possible to suppress the occurrence of the quadratic pole. As a result, the operational amplifier of the invention has a sufficient phase margin and assures a broad band operation. Further the operational amplifier of the invention which can be formed of an element having a low transconductance can be integrated with a greater density.

Further with the operational amplifier apparatus of the invention, it is unnecessary to considerably reduce the output resistance $r_2$ of the second stage operational amplifier $A_2$ as has been the case with the conventional operational amplifier apparatus. Therefore, it is possible to let the second stage operational amplifier $A_2$ have an extremely large gain.

This invention need not be limited to the aforementioned embodiments, but is applicable in various modifications. The second and third stage operational amplifiers $A_2$ and $A_3$ may respectively formed of a plurality of amplifier units.

The first feedback circuit 51 may be formed of a capacitor $C_{12}$ shown in FIG. 11 and a resistor R connected in series thereto as shown in FIG. 11. The second feedback circuit 52 may be formed of a capacitor $C_{13}$ and a resistor R connected in series thereto as shown in FIG. 11. As seen from FIG. 12, it is further possible to connect a noninverting amplifier A having a gain of substantially 1 to the input side of the capacitor $C_{12}$ or $C_{13}$. Further as shown in FIG. 13, the feedback circuit 51 may be formed of a capacitor $C_{12}$, resistor R and amplifier A all connected in series. Likewise, the feedback circuit 52 may be formed of a capacitor $C_{13}$, resistor R and amplifier A all connected in series.

When a resistor R is provided as shown in FIGS. 11 and 13, it is possible to produce a zero point frequency $f_0 \simeq 1/2\pi R C_{13}$. Therefore, it is possible to broaden the phase margin by 45° at the frequency point. Application of a noninverting amplifier A as shown in FIGS. 12 and 13 can suppress the occurrence of a feed forward effect.

What we claim is:

1. An operational amplifier which comprises:
   first amplifying means;
   second amplifying means connected to the output of the first amplifying means and carrying out inverting amplification;
   third amplifying means connected to the output of the second amplifying means and carrying out noninverting amplification with a gain of substantially 1, said third amplifying means including a source follower circuit and being formed of a noninverting amplifier whose output impedance is lower than its input impedance; said first, second and third amplifying means each comprising at least one MOS transistor;
   first feedback means connected directly between the output and input of the second amplifying means and carrying out a phase-compensating function; and
   second feedback means connected between the output of the third amplifying means and the input of the second amplifying means and carrying out a phase compensating function.

2. The operational amplifier according to claim 1, wherein the first and second feedback means are each formed of a phase-compensating capacitive element.

3. The operational amplifier according to claim 2, wherein a resistive element is connected in series to the phase-compensating capacitive elements of the first and second feedback means.

4. The operational amplifier according to claim 2, wherein a noninverting amplifier having a gain of substantially 1 is connected to the inputs of the phase-compensating capacitive elements of the first and second feedback means.

5. The operational amplifier according to claim 4, wherein a resistive element is connected between the inputs of the capacitive element and the noninverting amplifier.

* * * * *